(12) United States Patent
Kobolla et al.

(10) Patent No.: US 10,079,120 B2
(45) Date of Patent: Sep. 18, 2018

(54) POWER ELECTRONIC SWITCHING DEVICE, ARRANGEMENT HEREWITH AND METHODS FOR PRODUCING THE SWITCHING DEVICE

(71) Applicant: SEMIKRON ELEKTRONIK GMBH & CO. KG, Nuremberg (DE)

(72) Inventors: Harald Kobolla, Seukendorf (DE); Jörg Ammon, Erlangen (DE)

(73) Assignee: SEMIKRON ELEKTRONIK GMBH & CO. KG, Nuremberg (DE)

( * ) Notice: Subject to any disclaimer, the term of this patent is extended or adjusted under 35 U.S.C. 154(b) by 0 days.

(21) Appl. No.: 15/654,774

(22) Filed: Jul. 20, 2017

(65) Prior Publication Data
US 2018/0025854 A1     Jan. 25, 2018

(30) Foreign Application Priority Data

Jul. 22, 2016 (DE) .......................... 10 2016 113 536

(51) Int. Cl.
H04B 1/00     (2006.01)
H01H 1/20     (2006.01)
H01H 9/52     (2006.01)

(52) U.S. Cl.
CPC ................ *H01H 1/20* (2013.01); *H01H 9/52* (2013.01)

(58) Field of Classification Search
CPC ....... H04B 1/707; H04B 1/709; H04B 1/7075
See application file for complete search history.

(56) References Cited

U.S. PATENT DOCUMENTS

2015/0325494 A1* 11/2015 Kroneder ............ H01L 23/4006
361/715

FOREIGN PATENT DOCUMENTS

| DE | 19617055 | 6/1997 |
|---|---|---|
| DE | 101 21 970 | 11/2002 |
| DE | 10 2004 018 477 | 11/2005 |
| DE | 10 2006 025 531 | 4/2008 |
| DE | 10 2010 039 824 | 3/2012 |
| DE | 10 2013 104 949 | 4/2014 |

(Continued)

OTHER PUBLICATIONS

DE 10 2016 113 536.4, German Search Report dated Mar. 15, 2017, 8 pages—German, 9 pages—English.

(Continued)

*Primary Examiner* — Shuwang Liu
*Assistant Examiner* — Gina McKie
(74) *Attorney, Agent, or Firm* — Andrew F. Young, Esq.; Lackenbach Siegel, LLP

(57) ABSTRACT

A switching device has a substrate, a connection device and a pressure device, wherein the substrate has electrically insulated conductor tracks, and a power semiconductor component is on one of the conductor tracks with a first main surface and is conductively connected thereto. The connection device is a film composite with conductive film and an insulating film and forms a first and a second main surface. The switching device is connected by the connection device and a contact area of the second main surface of the power semiconductor component is connected to a first contact area of the first main surface of the connection device in a force-locking and electrically conductive manner with a pressure body and a pressure element projecting toward the power semiconductor component.

14 Claims, 4 Drawing Sheets

(56) References Cited

FOREIGN PATENT DOCUMENTS

DE   10 2013 104 950   4/2014
DE   10 2013 108 185   2/2015

OTHER PUBLICATIONS

EP 17179728.5, Extended European Search Report dated Dec. 17, 2008, 4 pags—German, 1 page—English.

* cited by examiner

POWER ELECTRONIC SWITCHING DEVICE, ARRANGEMENT HEREWITH AND METHODS FOR PRODUCING THE SWITCHING DEVICE

CROSS REFERENCE TO RELATED APPLICATIONS

This application relates to, and claims priority from, DE Ser. No. 10 2016 113 536.4 filed Jul. 22, 2016, the entire contents of which are incorporated herein by reference.

FIGURE SELECTED FOR PUBLICATION

FIG. 3

BACKGROUND OF THE INVENTION

Field of the Invention

The invention describes a power electronic switching device which can form a basic cell of a power semiconductor module or of a power electronic system by itself or in combination with further, preferably identical, basic cells it forms the power electronic basic building block of the power semiconductor module or of the power electronic system. Furthermore, the invention describes an arrangement for a power electronic switching device and a method for producing a particularly preferred embodiment of such a power electronic switching device.

Description of the Related Art

The prior art, for example disclosed in DE 10 2013 104 949 B3 discloses a switching device comprising a substrate, a power semiconductor component, a connection device, load terminal devices and a pressure device. In this case, the substrate has electrically insulated conductor tracks, wherein a power semiconductor component is arranged on a conductor track. The connection device is embodied as a film composite comprising an electrically conductive film and an electrically insulating film and has a first and a second main surface. The switching device is thereby connected in a circuit-conforming manner internally. The pressure device has a pressure body having a first cutout, projecting from which a pressure element is arranged, wherein the pressure element presses onto a section of the second main surface of the film composite and in this case said section is arranged within the area of the power semiconductor component in projection along the direction of the normal to the power semiconductor component.

ASPECTS AND SUMMARY OF THE INVENTION

With knowledge of the conditions mentioned, the invention is based on the object of presenting a power electronic switching device and an arrangement therewith and a method for producing the switching device, wherein the switching device is optimized with regard to its complexity and its production outlay.

This object is achieved according to the invention by means of a power electronic switching device by means of an arrangement comprising a power electronic switching device and a production method therefore.

The switching device according to the invention is embodied comprising a substrate, comprising a connection device and comprising a pressure device, wherein the substrate has conductor tracks electrically insulated from one another, and a power semiconductor component is arranged on one of the conductor tracks with its first main surface and is electrically conductively connected thereto, wherein the connection device is embodied as a film composite comprising an electrically conductive film and an electrically insulating film and thus forms a first and a second main surface, wherein the switching device is connected in a circuit-conforming manner internally by means of the connection device in this case and a contact area of the second main surface of the power semiconductor component is connected to a first contact area of the first main surface of the connection device in a force-locking and electrically conductive manner, for this purpose the pressure device has a pressure body and a pressure element projecting therefrom in the direction of the power semiconductor component, wherein the pressure element presses on a first section of the second min surface of the film composite and in this case said first section is arranged completely within the area of the power semiconductor component in projection along the direction of the normal to the power semiconductor component.

In the case of this switching device, therefore, a cohesive connection of the contact area of the second main surface of the power semiconductor component to the first contact area of the first main surface of the connection device is explicitly dispensed with. As a result, in comparison with the prior art, a cohesive connection, which is complex to produce and is preferably embodied as a pressure sintering connection, is replaced by a force-locking connection. This deliberately accepts the situation if the contact area available for current conduction, that is to say the functionally effective contact area, of the connection between the power semiconductor component and the connection device has a smaller surface area than the terminal area of the power semiconductor component. The terminal area in this case corresponds to the metallization, that is to say to the load terminal area of the power semiconductor component.

It is preferred if a second contact area of the connection device is connected to a contact area of the conductor tracks of the substrate that are assigned thereto in a force-locking or cohesive and electrically conductive manner.

Likewise, the power semiconductor component can be electrically conductively connected by its first main surface to the conductor track assigned to it in a force-locking or cohesive manner.

It is preferred in this case if the respective cohesive connection is embodied as a soldering, adhesive or, in particular, pressure sintering connection that is routine in the art.

It is particularly preferred if the pressure body has a first cutout, from which the pressure element projects. In this case, it is furthermore advantageous if said first cutout of the pressure body is embodied as a depression proceeding from a first main surface, in this case the pressure element completely or approximately completely fills said cutout of the pressure body, and the pressure element projects from the cutout of the pressure body at the first main surface thereof in the direction of the connection device, more precisely the second main surface thereof. In this case, the ratio of lateral extent to vertical extent of the pressure body should have a ratio of more than 2 to 1, in particular of more than 4 to 1.

Preferably, the surface area of the first section of the second main surface of the film composite has at least 20%, in particular at least 50%, of the area of the assigned power semiconductor component. In this case, area of the power semiconductor component is understood to mean the entire areal extent thereof, that is to say not just that of the terminal or contact areas.

The arrangement is embodied according to the invention comprising an above-described electronic switching device, comprising a cooling device and comprising a pressure introducing device, wherein this pressure introducing device is supported indirectly or directly against the cooling device and introduces pressure preferably centrally on the pressure device, and the switching device is thereby connected to the cooling device in a force-locking manner.

Likewise, on account of the particularly effective introduction of pressure it is possible that a heat-conducting layer, in particular a thermally conductive paste, having a thickness of less than 20 µm, in particular of less than 10 µm, in particular of less than 5 µm, can be arranged between the substrate, in particular that part of the substrate on which the power semiconductor components are arranged, and the cooling device.

It may likewise be preferred if the cooling device is a preferably metallic baseplate of a power semiconductor module or a heat sink.

The method according to the invention for producing a particularly preferred embodiment of an abovementioned power electronic switching device comprises the following steps, preferably to be applied in this order:

A. providing the substrate comprising an insulation layer and comprising conductor tracks electrically insulated from one another wherein, on one of these conductor tracks, a power semiconductor component is arranged and is connected to this conductor track in a cohesive manner;

B. providing the connection device embodied as a film stack embodied alternately with two electrically conductive, inherently structured films and an electrically insulating film between the two conductive films;

C. arranging an adhesive substance on the substrate or on, the connection device at adhesive sections which thus arise and are characterized in that they do not serve for electrically conductive connection between the connection partners, that is to say the connection device and the substrate;

D. arranging and adhesively connecting the connect-ion device to the substrate by means of the adhesive substance;

E. introducing pressure on the connection device by means of a pressure device and a pressure introducing device in such a way that a force-locking electrically conductive connection is formed between the connection device and the assigned power semiconductor component.

Advantageously, a force-locking electrically conductive connection is additionally also formed between the connection device and the conductor track assigned thereto.

It goes without saying that, unless excluded per se, the features mentioned in the singular, in particular the power semiconductor component, can be present multiply in the respective power electronic switching device or the arrangement therewith.

It goes without saying that the different configurations of the invention can be realized individually or in arbitrary combinations in order to achieve improvements. In particular, the features mentioned and explained above and hereinafter, irrespective of whether they are mentioned in the context of the power electronic switching device, the arrangement or the method, can be used not only in the combinations indicated, but also in other combinations, or by themselves, without departing from the scope of the present invention.

The above and other aspects, features and advantages of the present invention will become apparent from the following description read in conjunction with the accompanying drawings, in which like reference numerals designate the same elements.

DETAILED DESCRIPTION OF THE PREFERRED EMBODIMENTS

Figure 1:
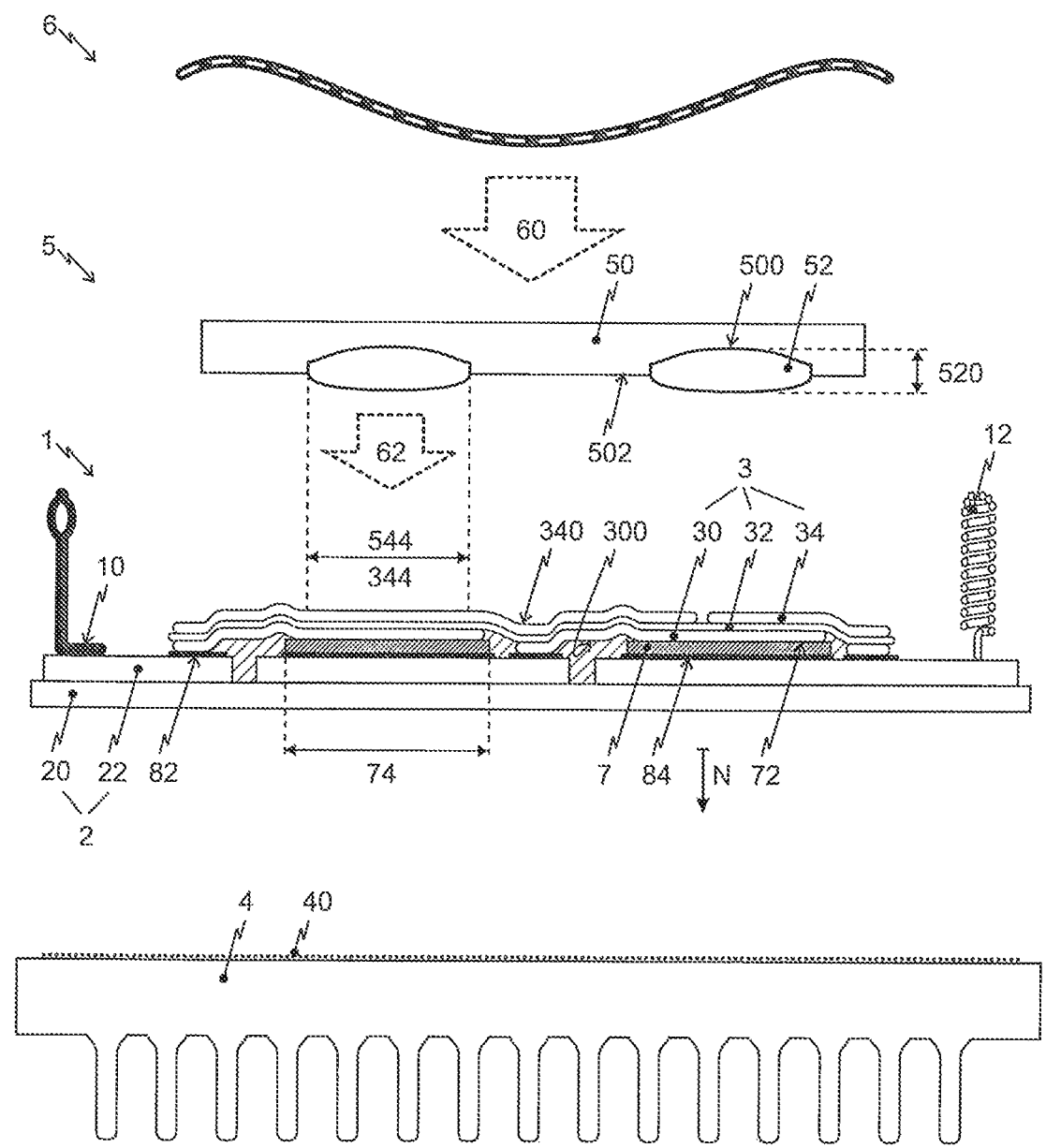
FIG. 1 shows, in an exploded illustration, an arrangement according to the invention comprising a power electronic switching device according to the invention.

Reference will now be made in detail to embodiments of the invention. Wherever possible, same or similar reference numerals are used in the drawings and the description to refer to the same or like parts or steps. The drawings are in simplified form and are not to precise scale. The word 'couple' and similar terms do not necessarily denote direct and immediate connections, but also include connections through intermediate elements or devices. For purposes of convenience and clarity only, directional (up/down, etc.) or motional (forward/back, etc.) terms may be used with respect to the drawings. These and similar directional terms should not be construed to limit the scope in any manner. It will also be understood that other embodiments may be utilized without departing from the scope of the present invention, and that the detailed description is not to be taken in a limiting sense, and that elements may be differently positioned, or otherwise noted as in the appended claims without requirements of the written description being required thereto.

Various operations may be described as multiple discrete operations in turn, in a manner that may be helpful in understanding embodiments of the present invention; however, the order of description should not be construed to imply that these operations are order dependent.

Although only a few embodiments have been disclosed in detail above, other embodiments are possible and the inventors intend these to be encompassed within this specification. The specification describes certain technological solutions to solve the technical problems that are described expressly and inherently in this application. This disclosure describes embodiments, and the claims are intended to cover any modification or alternative or generalization of these embodiments which might be predictable to a person having ordinary skill in the art.

FIG. 1 shows, in a schematic exploded illustration, a first configuration of a power electronic switching device 1 according to the invention. The illustration shows a substrate 2 embodied in a routine manner in the art, in principle, and comprising an insulating substance body 20 and conductor tracks 22 arranged thereon and respectively electrically insulated from one another, said conductor tracks having different potentials, in particular load potentials, but also auxiliary, in particular switching and measurement, potentials, of the switching device. Three conductor tracks 22 having load potentials such as are typical of a half-bridge topology are specifically illustrated here.

A respective power semiconductor component 7 is arranged on two conductor tracks 22, which power semiconductor component can be embodied in a routine manner in the art as an individual switch, for example as a MOSFET, or as an IGBT with a power diode connected in antiparallel, which is illustrated here. The power semiconductor components 7, more precisely their first contact area (700, cf. FIG. 2) of the first main surface (70, cf. FIG. 2), are electrically conductively connected to the conductor tracks 22 cohesively and in a manner conventional in the art, preferably by means of a pressure sintering connection 84.

The internal connections of switching device 1 are formed by means of a connection device 3 made from a film composite having alternately electrically conductive films 30, 34 and electrically insulating films 32. Here the film composite has exactly two conductive films and one insulating film arranged therebetween. In this case, the surface of said film composite 3 facing the substrate 2 forms the first main surface 300 of said film composite, while the opposite surface forms the second main surface 340 of said film composite. Particularly the conductive films 30, 34 of the connection device 3 are inherently structured and thus form conductor track sections electrically insulated from one another. Said conductor track sections connect in particular the respective power semiconductor component 7, more precisely the contact areas thereof on the side facing away from the substrate 2, to conductor tracks 22 of the substrate. In this configuration, the conductor track sections are connected to the contact areas of the substrate 2 cohesively by means of a pressure sintering connection (82, cf, FIG. 2).

For external electrical linking, the power electronic switching device 1 has load and auxiliary terminal elements, only the load terminal elements being illustrated here. Said load terminal elements are embodied purely by way of example as metal shaped bodies 10 connected cohesively by a contact foot to a conductor track 22 of the substrate 2, advantageously likewise by means of a pressure sintering connection. Said load terminal elements can likewise be embodied in a routine manner in the art as contact spring 12. In principle, parts of the connection device 3 itself can also be embodied as load or auxiliary terminal elements. The auxiliary terminal elements (not illustrated), such as gate or sensor terminals, are preferably likewise embodied in a routine manner in the art.

The pressure device 5, routine in the art, has a first main surface 502 facing the substrate 2 and a second main surface facing away from the substrate 2 and is illustrated here at a distance from the connection device 3, for the sake of clarity. The pressure device 5 consists of a pressure body 50 and a plurality, two being illustrated, of pressure elements 52. The pressure body 50 is embodied particularly rigidly in order to be able to pass on pressure introduced by it homogeneously to the pressure elements 52. The pressure elements 52 are arranged in cutouts 500 of the pressure body 50, which are embodied as depressions proceeding from a first main surface 502. They completely fill said cutouts 500 and project from them at the first main surface 502 in the direction of the substrate 2.

For this purpose and against the background of the thermal loads during operation of the switching device, the pressure body 50 consists of a high-temperature-resistant thermoplastic, in particular of polyphenylene sulphide. The pressure elements 52 must be able to exert a substantially constant pressure during operation and in this case in particular at different temperatures. For this purpose, the pressure elements 52 consist of an elastomer, preferably of a silicone elastomer, particularly preferably of so-called crosslinked liquid silicone (LSR—Liquid Silicone Rubber). The ratio of lateral extent 544 to vertical extent 520 of the pressure body 52 here has a ratio of 4 to 1.

The arrangement furthermore has a heat sink 4, the surface of which is covered with a heat-conducting layer 40, on which the power electronic switching device 1, more precisely the substrate 2 thereof, is arranged. On account of the configuration of the arrangement according to the invention, the heat-conducting layer 40 can have a very small thickness, which here is between 5 µm and 10 µm. In principle, the heat-conducting layer could be completely dispensed with .This is dependent on the surface constitution, in particular the roughness of the heat sink 4.

Alternatively, the insulation layer 20 of the substrate 2 can be embodied as an electrically insulating film that is laminated directly onto the heat sink 4. In this case, too, the conductor tracks 22 can be embodied as planar conduction elements composed of copper. The latter then advantageously have a thickness of 0.5 mm to 1.0 mm.

The arrangement furthermore has a pressure introducing device 6, which is arranged above the connection device 3. By means of said pressure introducing device 6, which is supported against the heat sink in a manner not illustrated, pressure 60 is introduced on the pressure body 50. Said pressure 60 is transmitted in each case as partial pressure 62 by means of the pressure elements 52 directly to a first section 344 of the second main surface 340 of the film composite 3. Said section 344 then indirectly presses, with formation of the force-locking connection, a contact area (304, cf. FIG. 2) of the first main surface 300 onto an assigned contact area (720, cf. FIG. 2) of the second main surface 72 of the power semiconductor component 7. Said section 344 is arranged within the area 74 of the power semiconductor component 7 in projection along the direction of the normal N to the power semiconductor component 7.

The introduced pressure 60 furthermore presses the entire substrate 2 onto the heat sink 4. The two pressure contacts, the electrically conductive between the connection device 3 and the power semiconductor component 7, and also between the substrate 2 and the heat sink 4, is effected in each case in the direction of the normal N to the power semiconductor component 7. Consequently, firstly, a highly efficient force-locking and electrically conductive connection between the connection device 3 and the power semiconductor component 7 is formed, said connection exhibiting extremely low contact resistance. Secondly, at the same time a likewise efficient, thermally conductive connection between the substrate 2 and the heat sink 4 is formed, which connection forms its most effective heat transfer precisely at that location with the highest evolution of heat, that is to say the power semiconductor component 7.

Figure 2:
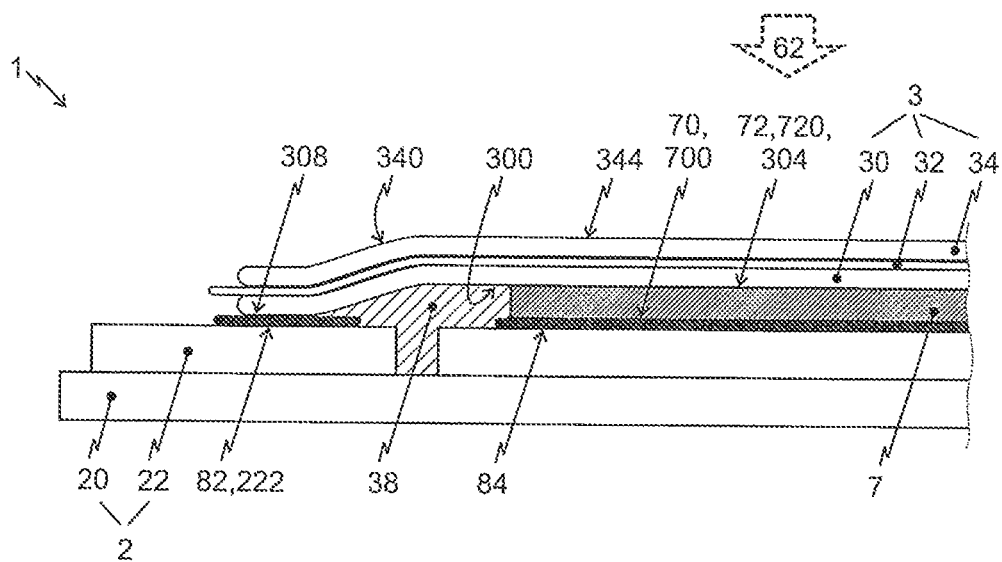
FIGS. 2 to 4 show different configurations of power electronic switching devices according to the invention.

FIG. 2 shows a sectional view of a first configuration of a power electronic switching device 1 according to the invention, such as is basically already illustrated in FIG. 1.

The illustration here shows the substrate 2, comprising one insulating layer 20 and two conductor tracks 22. On the right-hand conductor track 22, a power semiconductor component 7, embodied as a power diode, is arranged and electrically conductively connected to the conductor track 22 by means of a cohesive connection, here a pressure sintering connection 84.

The power semiconductor component 7, more precisely its contact area 720 of the second main surface 72 that faces away from the substrate 2, is electrically conductively connected to the left-hand conductor track 22 by means of a connection device 3. For this purpose, the connection device 3 has a first electrically conductive film 30, wherein the contact area 304 thereof is implemented with the corresponding contact area 720 of the power semiconductor component 7 by means of a force-locking connection.

This force-locking connection is formed by a partial pressure 62, cf. FIG. 1, being introduced directly on a first section 344 of the second main surface 340 of the connection device, here of the film composite 3. The respective contact locations 304, 720 of the force-locking connection are preferably provided here with a gold surface, in particular a few micrometres thin gold layer, since these have the best contact properties and contact resistances. Moreover, the respective contact locations 304, 720 of the force-locking connection have a roughness depth (Rz) of less than 5 μm, in particular of less than 2 μm, and a mean roughness (Ra) of less than 1 μm, in particular of less than 0.5 μm, in each case determined in accordance with EN ISO 4287, the contents of which are incorporated herein by reference.

The second contact area 720 of the power semiconductor component 7 is electrically conductively connected to the left-hand conductor track 22. For this purpose, the first metal film 30 of the film composite 3 extends from the contact location 304 with the power semiconductor component 7 as far as a contact location 222 of the left-hand conductor track 22. The cohesive connection there between the contact location 308 of the connection device 3 and the contact location 222 of the conductor track 22 of the substrate 2 is formed by means of a pressure sintering connection 82 or some other connection that is routine in the art.

The connection device 3 further has an electrically insulating film 32 and a further electrically conductive film 34, which in interaction form the further circuit-conforming internal connection of the power electronic switching device 1.

Moreover, the power electronic switching device 1 also comprises a preferably gel-like insulating substance 38, which is arranged in the interspace between substrate 2, connection device 3 and power semiconductor component 7. Said insulating substance serves for internal electrical insulation, in particular that between the first conductive film 30 of the connection device 3 and the right-hand conductor track 22 of the substrate 2.

Figure 3:
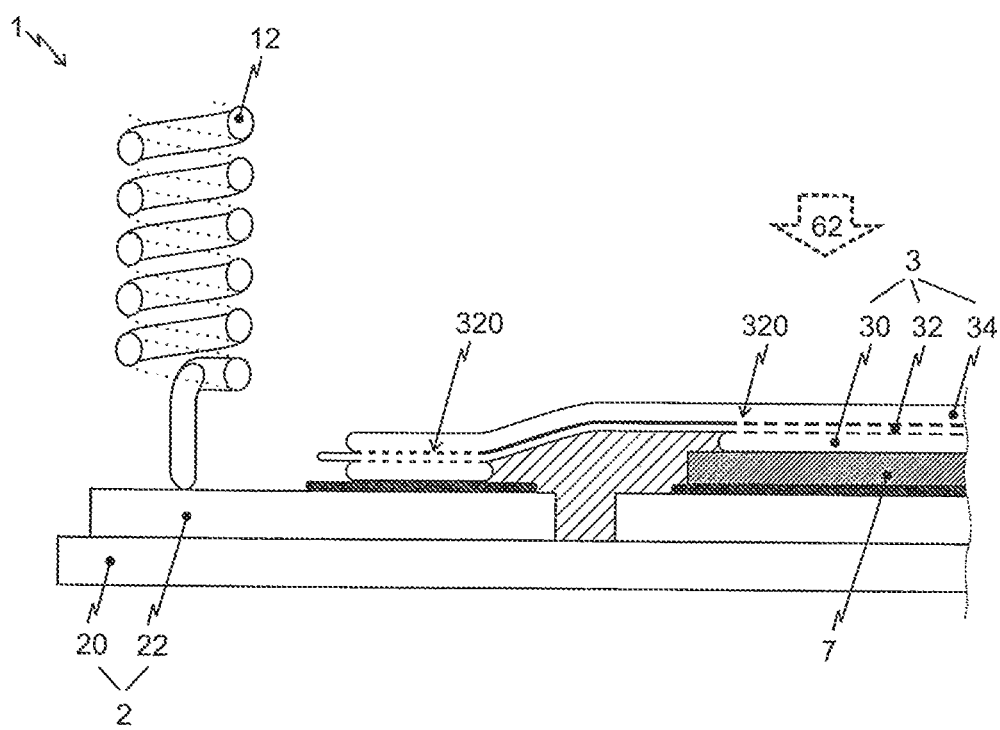

FIG. 3 shows a sectional view of a second configuration of a power electronic switching device 1 according to the invention. The electrically conductive connection between the power semiconductor component 7 and the connection device 3 is formed here once again by means of the force-locking connection described above. The cohesive connection of the power semiconductor component 7 to the conductor track 22 of the substrate 2 is likewise formed in the manner as described above.

In contrast to the first configuration in accordance with FIG. 2, here the connection device 3 has, in the contact regions with respect to the power semiconductor component 7 and also with respect to the left-hand conductor track 22, only sections of the first electrically conductive film 30 which are not directly connected to one another. Rather, plated-through holes 320 from the first conductive film 30 to the second conductive film 34 through the insulating film 32 are arranged in said sections. Consequently, the electrical connection between the left-hand conductor track 22 and the power semiconductor component 7 is effected via the second electrically conductive film 34. Moreover, a terminal element 12, embodied here by way of example as a spring contact element, is illustrated on the left-hand conductor track 22.

Figure 4:
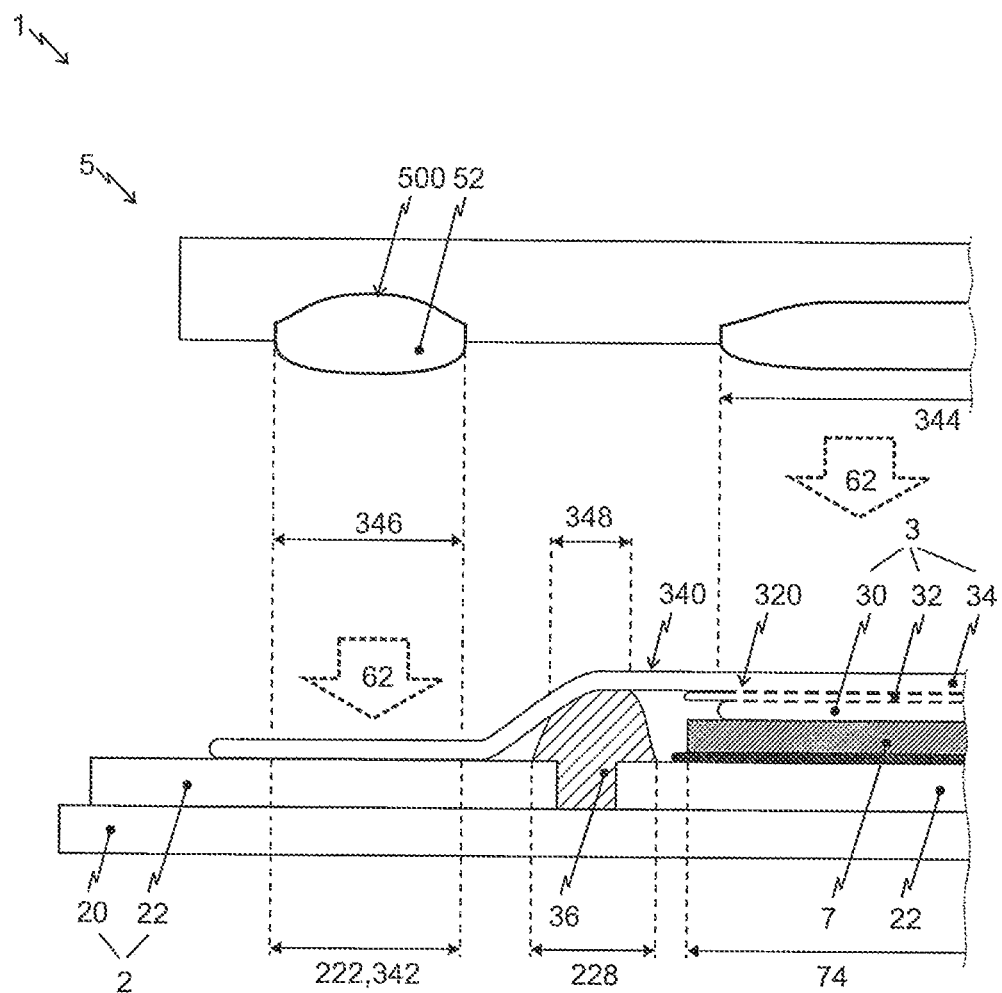

FIG. 4 shows a sectional view of a third configuration of a power electronic switching device 1 according to the invention, said third configuration being produced in accordance with the second method according to the invention. The substrate 2 with the power semiconductor component 7 is embodied here in the manner as already described with regard to FIG. 3.

An electrically insulating adhesive substance 36, preferably an adhesive based on silicone rubber, is arranged on the substrate 2 between the two conductor tracks 22 and in a manner overlapping the latter in edge regions. Without application of pressure by means of the pressure device 5, said adhesive substance provides for an adhesive, that is to say at least adherent, connection between the substrate 2 in the section 228 thereof and the connection device 3 in the section 348 thereof. What is essential here is that said adherent connection does not contribute to the electrical conduction and is thus also only arranged in sections 228, 348 in which no electrically conductive contact is formed between the connection device 3 and the substrate 2, more precisely a conductor track 22 or the power semiconductor component 7.

The electrically conductive connection between the power semiconductor component 7 and the left-hand conductor track 22 by means of the connection device 3 is formed here by the second electrically conductive film 34 rather than by the first electrically conductive film. In this case, in contrast to the configuration in accordance with FIG. 3, no section of the first conductive film 30 and thus also no plated-through hole is necessary in the region of the left-hand conductor track 22. In the region of the power semiconductor component 7, the configuration of the connection device 3 is as described with regard to FIG. 3.

The electrically conductive connection between the connection device 3 and the power semiconductor component 7 and between the connection device 3 and the left-hand, i.e. the assigned conductor track 22 of the substrate 2, is embodied as a force-locking connection. For this purpose, a respective partial pressure 62 (cf also FIG. 1) is introduced on the respective connection by means of a respective assigned pressure element 52 of the pressure device 5. In this case, therefore, a partial pressure 62 is exerted on a second section 346 of the second main surface 340 of the connection device, as a result of which a contact area 342 of the second electrically conductive film 34 is pressed onto a contact area 222 of the left-hand conductor track 22 and is electrically conductively connected thereto in a force-locking manner.

A major advantage of this third configuration of the power electronic switching device 1 is that a cohesive and electrically conductive connection needs to be implemented here exclusively at the substrate level, i.e. between the power semiconductor component 7 and the assigned conductor track 22. Such connections are routine in the art and are relatively simple to produce even in the case of pressure sintering connections. The connection device 3 then only becomes adherent, which is likewise simple to implement and enables a sufficient fixing of the connection partners, that is to say of the substrate and the connection device. It is only during the operation of the power electronic switching device that the described application of pressure takes place, which here forms the force-locking electrically conductive contact between the connection device 3 and the power semiconductor component 7 and also between the connection device 3 and the conductor track 22 of the substrate 2.

Figure 5A:
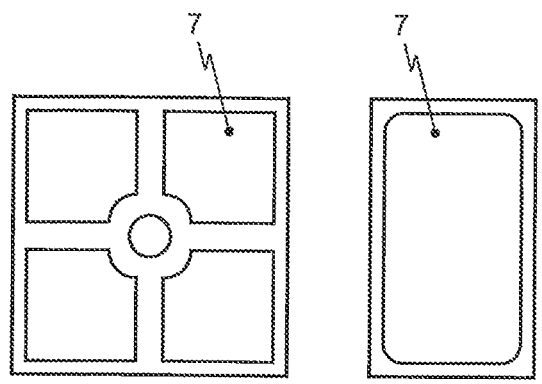
FIGS. 5A, 5B, 5C, and 5D show a plan view of a power electronic switching device in different sectional planes.

FIGS. 5A-5D show a plan view of a power electronic switching device 1 in different sectional planes. The sectional plane in accordance with FIG. 5A shows two power semiconductor components 7, which are arranged typically, but in a manner not illustrated, on a common conductor track of a substrate. Without restricting the generality, this involves a transistor having a central gate terminal area and emitter terminal areas bordering the latter, and a diode having a cathode terminal area.

Figure 5B:
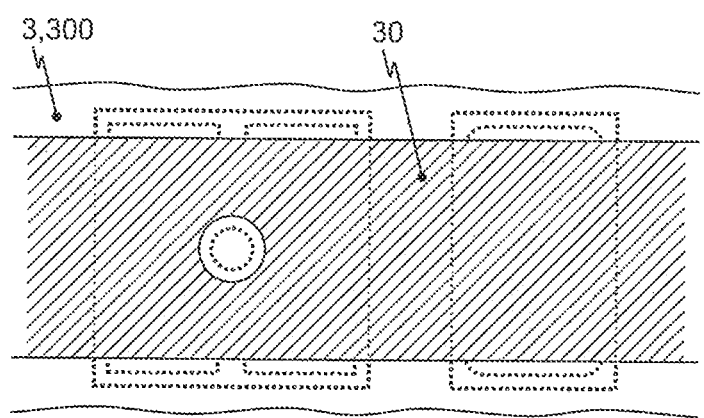

FIG. 5B shows the first, inherently structured, electrically conductive film 30 of the connection device 3. This forms an electrically conductive connection between the emitter terminal areas of the transistor and the cathode terminal area of the diode. In this case, a cutout is implemented for the gate terminal area of the transistor.

Figure 5C:
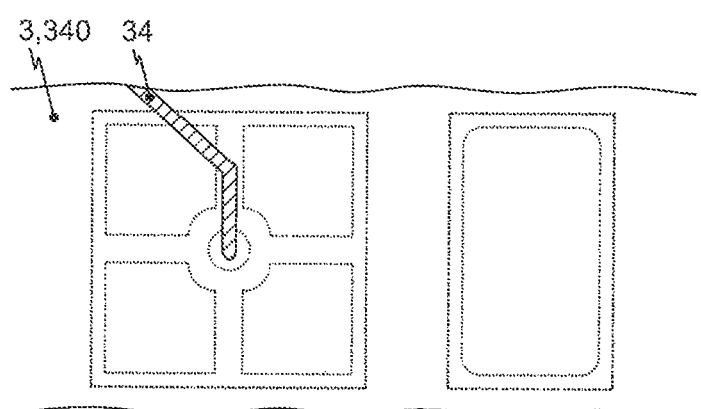

FIG. 5C shows the second inherently structured electrically conductive film 34 of the connection device 3. This forms an electrically conductive connection to the gate terminal area of the transistor.

Figure 5D:
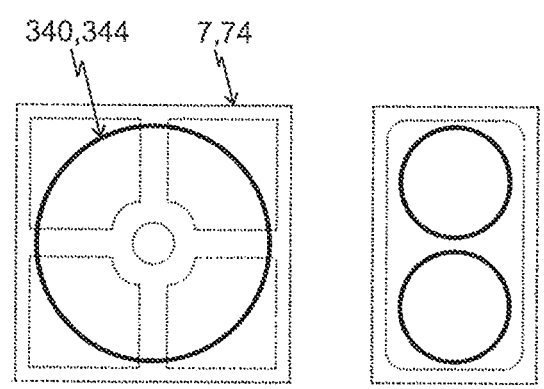

FIG. 5D shows as it were the footprint of the contact elements of the contact device that are assigned to the power semiconductor components 7, wherein only one contact element is assigned to the transistor, on account of the square basic shape thereof, and two contact elements are assigned to the diode, on account of the rectangular basic shape thereof. The respective footprint corresponds to those first sections 344 on the second main surface 340 of the connection device 3 which are arranged in alignment with the power semiconductor components in the direction of the normal and are projected here onto the respective power semiconductor component. It becomes clear here that the area of the footprint, that is to say that area which is intended for introducing pressure, covers the largest possible portion of the area of the power semiconductor component, without going beyond said area.

Also, the inventors intend that only those claims which use the words "means for" are intended to be interpreted under 35 USC 112, sixth paragraph. Moreover, no limitations from the specification are intended to be read into any claims, unless those limitations are expressly included in the claims.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

Having described at least one of the preferred embodiments of the present invention with reference to the accompanying drawings, it will be apparent to those skills that the invention is not limited to those precise embodiments, and that various modifications and variations can be made in the presently disclosed system without departing from the scope or spirit of the invention. Thus, it is intended that the present disclosure cover modifications and variations of this disclosure provided they come within the scope of the appended claims and their equivalents.

What is claimed is:

1. A power electronic switching device (1), comprising:
   a substrate (2), comprising a connection device (3);
   a pressure device (5);
   the substrate (2) has a plurality of conductor tracks (22) electrically insulated from one another;
   a power semiconductor component (7) with a first semiconductor main surface (70) is arranged on one of the plurality of conductor tracks (22) and is electrically conductively connected to said one of said conductor tracks (22);
   the connection device (3) is embodied as a film composite;
   said film composite includes at least one electrically conductive film (30, 34) and an electrically insulating film (32) and forms a first film composite main surface (300) opposite a second film composite main surface (340);
   the switching device is connected in a circuit-conforming manner internally by means of the connection device (3) and a second semiconductor contact area (720) of a second semiconductor main surface (72) of the power semiconductor component (7) is connected to a first film contact area (304) of the first film composite main surface (300) of the connection device (3) in a force-locking and an electrically conductive manner;
   the pressure device (5) has a pressure body (50) and a pressure element (52) projecting therefrom in a direction of the power semiconductor component (7);
   the pressure element (52) pressing a first film section (344) of the second film composite main surface (340) of the film composite (3); and
   wherein, said first film section (344) is arranged within an area (74) of the power semiconductor component (7) in a projection along a direction that is normal (N) to the power semi-conductor component (7).

2. The switching device, according to claim 1, further comprising:
   a second film contact area (308) of the connection device (3) is in a connection with a second conductor contact area (222) of one of the assigned conductor tracks (22) of the substrate (2) in one of a force-locking manner and a cohesive manner and an electrically conductive manner.

3. The switching device, according to claim 2, wherein:
   said connection is said cohesive connection; and
   said cohesive connection is selected from one of a soldering connection, an adhesive connection, and a pressure sintering connection.

4. The switching device, according to claim 1, comprising:
   the power semiconductor component (7) being electrically and conductively connected by said first semiconductor main surface (70) to one of the conductor track (22) in at least one of a force-locking manner and a cohesive manner.

5. The switching device, according to claim 1, wherein:
   the pressure body (50) has at least a first cutout (500); and
   the pressure element (52) in said at least first cutout (500) and projecting therefrom.

6. The switching device, according to claim 4, wherein:
   the at least first cutout (500) of the pressure body (50) is a depression extending inwardly from a first main body surface (502); and
   the pressure element (52) at least partially fills the cutout (500) of the pressure body (50), and projects beyond said first main body surface (502).

7. The switching device, according to claim 5, wherein:
   a ratio of a lateral extent (544) of the pressure body (52) to a vertical extent (520) of the pressure body (52) is a ratio of more than 2 to 1.

8. The switching device, according to claim 1, wherein:
the pressure body (50) consists of a high-temperature-resistant thermoplastic;
said high-temperature-resistant thermoplastic includes at least a polyphenylene sulphide; and
the pressure element (52) is an elastomer selected from a group consisting of a silicone elastomer and a cross-linked liquid silicone.

9. The switching device, according to claim 1, wherein:
a surface area of the first film section (344) has at least 20% of the area (74) of the assigned power semiconductor component (7).

10. A power switching arrangement (100), comprising:
an electronic switching device (1) according to claim 1;
a cooling device (4) and a pressure introducing device (6);
said pressure introducing device (6) introduces pressure proximately centrally on the pressure device (5) of the switching device (1) and is supported against the cooling device (4); and
said pressure inducing device (6) is thereby connected to the cooling device (4) in a force-locking. manner.

11. The arrangement, according to claim 10, further comprising:
a heat-conducting layer (40) arranged between the substrate (2) and the cooling device (4); and
said heat-conducting layer (40) has a thickness of less than 20 μm.

12. The arrangement, according to claim 10, wherein:
the cooling device (4) is a metallic baseplate of one of a power semiconductor module and a heat sink.

13. A method for producing a power electronic switching device (1), comprising the steps of:

A. providing a substrate (2);
said substrate (2) further comprising an insulation layer (20) and comprising a plurality of conductor tracks (22) electrically insulated from one another;
a power semiconductor component (7) arranged on one of the conductor tracks (22) and connected to said conductor tract (22) in a cohesive manner;

B. providing a connection device (3);
said connection device is a film stack embodied alternately with two electrically conductive inherently structured films (30, 34) spaced by an electrically insulating film (32);

C. arranging an adhesive substance (36) on one of the substrate (2) and the connection device (3) at adhesive sections which do not serve for electrically conductive connection between the connection device (3) and the substrate (2);

D. arranging and adhesively connecting the connection device (3) to the substrate (2) by means of the adhesive substance (36); and E. introducing a pressure on the connection device (3) with a pressure device (5) and a pressure introducing device (6) and providing a force-locking electrically conductive connection between the connection device (3) and the assigned power semiconductor component (7).

14. The method, according to claim 13, wherein:
a force-locking electrically conductive connection is formed between the connection device (3) and the assigned conductor track (22).

* * * * *